(12) United States Patent
Yamamoto et al.

(10) Patent No.: US 11,258,113 B2
(45) Date of Patent: Feb. 22, 2022

(54) MANAGEMENT DEVICE, AND ELECTRICITY STORAGE SYSTEM

(71) Applicant: Panasonic Intellectual Property Management Co., Ltd., Osaka (JP)

(72) Inventors: Kento Yamamoto, Hyogo (JP); Yuta Kurosaki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 114 days.

(21) Appl. No.: 16/765,920

(22) PCT Filed: Dec. 28, 2018

(86) PCT No.: PCT/JP2018/048558
§ 371 (c)(1),
(2) Date: May 21, 2020

(87) PCT Pub. No.: WO2019/163301
PCT Pub. Date: Aug. 29, 2019

(65) Prior Publication Data
US 2020/0365951 A1 Nov. 19, 2020

(30) Foreign Application Priority Data
Feb. 23, 2018 (JP) .............................. JP2018-031228

(51) Int. Cl.
*H01M 10/48* (2006.01)
*G01R 31/389* (2019.01)
(Continued)

(52) U.S. Cl.
CPC .......... *H01M 10/48* (2013.01); *G01R 31/389* (2019.01); *G01R 31/3842* (2019.01); *G01R 31/396* (2019.01); *H02J 7/02* (2013.01)

(58) Field of Classification Search
CPC .............. H01M 10/48; H01M 10/0048; G01R 31/3842; G01R 31/389; G01R 31/396;
(Continued)

(56) References Cited

U.S. PATENT DOCUMENTS

| 9,880,224 B2* | 1/2018 | Kudo .................... G01R 31/382 |
| 10,530,287 B2* | 1/2020 | Matsumoto ....... H01M 8/04589 |
| 2015/0194707 A1* | 7/2015 | Park .................. H01M 10/4207 |
| | | 429/50 |

FOREIGN PATENT DOCUMENTS

| CN | 206712453 U | * 12/2017 | |
| JP | 2008-112740 | 5/2008 | |
| JP | 2014134488 A | * 7/2014 | ............. Y02E 60/10 |

OTHER PUBLICATIONS

International Search Report of PCT application No. PCT/JP2018/048558 dated Mar. 26, 2019.

* cited by examiner

*Primary Examiner* — M Baye Diao
(74) *Attorney, Agent, or Firm* — McDermott Will and Emery LLP

(57) ABSTRACT

A cell voltage measurement unit measures a voltage of each of a plurality of cells that are series-connected. A total voltage measurement unit measures a total voltage of the plurality of cells. A controller manages an internal impedance of each of the plurality of cells. The controller detects a ripple of the total voltage measured by the total voltage measurement unit, estimates a ripple of each cell voltage by multiplying the detected ripple of the total voltage by a ratio of the internal impedance of each cell to a resultant internal impedance of the plurality of cells, and determines whether the ripple of each cell voltage is within an allowable voltage range.

11 Claims, 6 Drawing Sheets

(51) Int. Cl.
*G01R 31/396* (2019.01)
*G01R 31/3842* (2019.01)
*H02J 7/02* (2016.01)

(58) Field of Classification Search
CPC ...... G01R 19/16542; H02J 7/02; H02J 7/005; H02J 7/00304; B60L 3/00; B60L 50/40; B60L 50/50; B60L 53/00; B60L 55/00; B60L 58/00; Y02E 60/10; Y02T 10/7072; Y02T 90/14
USPC .......................................................... 320/134
See application file for complete search history.

MANAGEMENT DEVICE, AND ELECTRICITY STORAGE SYSTEM

CROSS-REFERENCE TO RELATED APPLICATIONS

This application is a U.S. national stage application of the PCT International Application No. PCT/JP2018/048558 filed on Dec. 28, 2018, which claims the benefit of foreign priority of Japanese patent application 2018-031228 filed on Feb. 23, 2018, the contents all of which are incorporated herein by reference.

TECHNICAL FIELD

The present invention relates to a management device that manages a state of a plurality of series-connected cells, and relates to an electricity storage system.

BACKGROUND ART

In recent years, there has been an expanding demand for secondary batteries such as lithium-ion batteries and nickel-metal-hydride batteries. Secondary batteries are used for various use purposes such as in-vehicle use and stationary electricity storage use, for example, back up, peak shift, and frequency regulation (FR). Particularly in recent years, a volume of shipments of electric vehicles (EVs) and plug-in hybrid electric vehicles (PHEVs) have increased, and there have been more cases where an EV and/or PHEV is charged from a charger installed outside the vehicle.

Along with the increase, there have been more cases where an inexpensive and low-spec charger is used. A low-spec charger cannot sufficiently remove a ripple component generated when alternate-current (AC) power of a commercial power source system is rectified, and a current on which a large ripple component is superimposed flows into a secondary battery. Also in a stationary electricity storage use, downsizing and cost reduction of power conditioners are required; accordingly, there is a case where a current on which a large ripple component is superimposed flows into a secondary battery.

In a case of an electricity storage system including a plurality of series-connected cells, a voltage is measured for each cell to monitor whether each cell voltage is within an allowable voltage range (for example, see PTL 1). When the cells are charged from a low-spec charger, there is a concern that the cell voltages pulsate due to influence of a ripple current and surpass the allowable voltage range of cell.

CITATION LIST

Patent Literature

PTL 1; Unexamined Japanese Patent Publication No. 2008-112740

SUMMARY OF THE INVENTION

Because the ripple of cell voltage is a minute voltage fluctuation, a highly accurate voltage measurement circuit is necessary to highly accurately monitor the ripple of a cell voltage. It is further necessary to sample the cell voltage at a sampling frequency twice or more than a ripple frequency. To achieve this sampling, an expensive and large-sized voltage measurement circuit is necessary (for example, analog front-end IC). In particular, the circuit size needs to be larger for a larger number of series connection of the cells, and a system size and a cost will be increased.

The present invention has been conceived in view of the above circumferences, and an object of the present invention is to provide a technique that can measure a ripple of a voltage of each of a plurality of series-connected cells, with an inexpensive and small-scale circuit.

In order to solve the above issue, a management device of an aspect of the present invention includes: a cell voltage measurement unit that measures a voltage of each cell of a plurality of cells that are series-connected; a total voltage measurement unit that measures a total voltage of the plurality of cells; and a controller that manages an internal impedance of each cell of the plurality of cells. The controller detects a ripple of the total voltage measured by the total voltage measurement unit, estimates a ripple of each cell voltage by multiplying the ripple, which is detected, of the total voltage by a ratio of the internal impedance of each cell to a resultant internal impedance of the plurality of cells, and determines whether the ripple of each cell voltage is within an allowable voltage range.

The present invention enables to measure a ripple of a voltage of each of a plurality of series-connected cells with an inexpensive and small-scale circuit.

DESCRIPTION OF EMBODIMENTS

Figure 1:
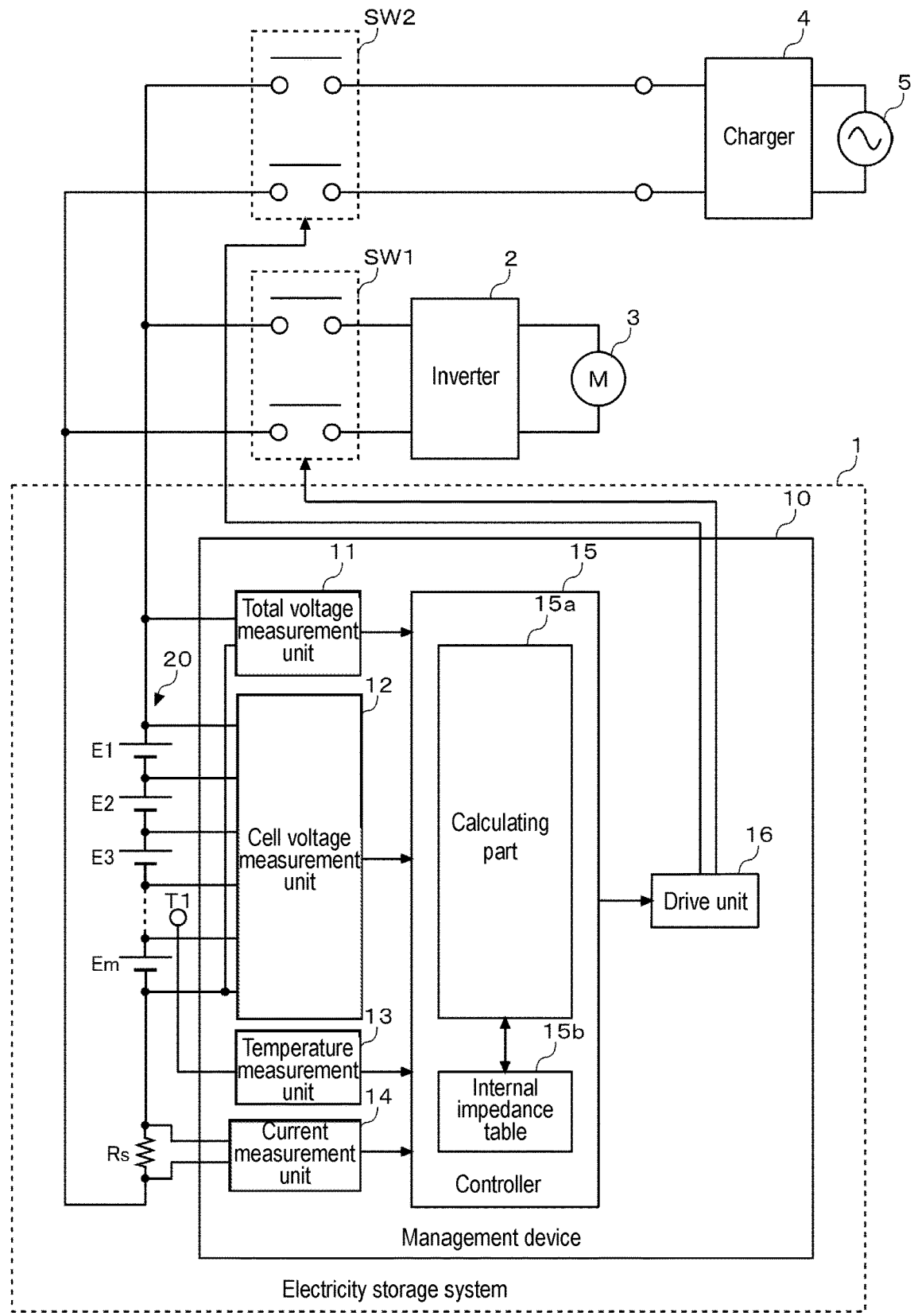
FIG. 1 is a diagram for describing an electricity storage system according to a first exemplary embodiment of the present invention.

FIG. 1 is a diagram for describing electricity storage system 1 according to a first exemplary embodiment of the present invention. In an example shown in FIG. 1, electricity storage system 1 according to the present exemplary embodiment is mounted on a vehicle as a drive battery for the vehicle. An EV or a PHEV that can be charged from a commercial power system (hereinafter, simply referred to as system 5) is assumed as the vehicle.

Electricity storage system 1 is connected to motor 3 through first relay SW1 and inverter 2. During power running, inverter 2 converts direct-current (DC) power supplied from electricity storage system 1 into AC power and supplies the AC power to motor 3. During regeneration, inverter 2 converts AC power supplied from motor 3 into DC power and supplies the DC power to electricity storage system 1. Motor 3 is a three-phase AC motor and rotates in accordance with the AC power supplied from inverter 2 during power running. During regeneration, motor 3 converts rotation energy due to deceleration into AC power and supplies the AC power to inverter 2.

First relay SW1 is inserted in connection wires connecting between electricity storage module 20 of electricity storage system 1 and inverter 2.

During running, management device 10 of electricity storage system 1 performs control to put first relay SW1 in an on-state (closed state) so as to electrically connect electricity storage module 20 to the power system of a vehicle. During not running, management device 10 performs control to put first relay SW1 in an off-state (open state) so as to electrically shut off between electricity storage module 20 and the power system of a vehicle. Note that instead of the relay, another type of switch such as a semiconductor switch may be used.

Electricity storage system 1 includes electricity storage module 20 and management device 10. Electricity storage module 20 is formed of a plurality of cells E1 to Em being series-connected. As the cells, it is possible to use lithium-ion battery cells, nickel-metal-hydride battery cells, lead battery cells, electric double-layer capacitor cells, lithium ion capacitor cells, or other types of cells. In the following, an example of the present specification is assumed to use lithium-ion battery cells (nominal voltage: 3.6 V to 3.7 V). The number of series connection of cells E1 to Em is determined depending on a drive voltage of motor 3.

Shunt resistor Rs is connected in series with the plurality of cells E1 to Em. Shunt resistor Rs functions as a current detection element. Note that instead of shunt resistor Rs, a hall element may be used. Further, there is provided temperature sensor T1 to detect a temperature of the plurality of cells E1 to Em. As temperature sensor T1, a thermistor can be used, for example.

Management device 10 includes total voltage measurement unit 11, cell voltage measurement unit 12, temperature measurement unit 13, current measurement unit 14, controller 15, and drive unit 16. Total voltage measurement unit 11 measures a both-end voltage (total voltage) of the plurality of series-connected cells E1 to Em. A configuration example of total voltage measurement unit 11 will be described later.

Cell voltage measurement unit 12 is connected to each node of the plurality of series-connected cells E1 to Em with a plurality of voltage lines and measures a voltage of each cell E1 to Em by measuring each voltage between neighboring two voltage lines. Cell voltage measurement unit 12 transmits the measured voltage of each cell E1 to Em to controller 15. Because cell voltage measurement unit 12 is in a high voltage state with respect to controller 15, cell voltage measurement unit 12 and controller 15 are connected to each other with communication lines in an insulated state.

Cell voltage measurement unit 12 can be configured with a general-purpose analog front-end IC or an application specific integrated circuit (ASIC). When small-sized and inexpensive cell voltage measurement unit 12 is used, cell voltage measurement unit 12 includes a multiplexer and an A/D converter. The multiplexer outputs the voltage between neighboring two voltage lines in order from above, to the A/D converter. The A/D converter converts an analog voltage having been input from the multiplexer, into a digital value. When large-sized and expensive cell voltage measurement unit 12 is used, differential amplifiers of a number corresponding to the number of cells are included in addition to a multiplexer and an A/D converter. Each differential amplifier amplifies the voltage between neighboring two voltage lines and outputs the amplified voltage to the multiplexer.

Temperature measurement unit 13 includes a voltage dividing resistor and an A/D converter. The A/D converter converts a voltage divided by temperature sensor T1 and the voltage dividing resistor into a digital value and outputs the converted digital value to controller 15. Controller 15 estimates the temperature of the plurality of cells E1 to Em based on the digital value.

Current measurement unit 14 includes a differential amplifier and an A/D converter. The differential amplifier amplifies a both-end voltage of shunt resistor Rs and outputs the amplified both-end voltage to the A/D converter. The A/D converter converts the voltage having been input from the differential amplifier into a digital value, and outputs the digital value to controller 15. Controller 15 estimates a current flowing through the plurality of cells E1 to Em based on the digital value.

Note that, when an A/D converter is mounted on controller 15 and an analog input port is provided on controller 15, temperature measurement unit 13 and current measurement unit 14 may output analog voltages to controller 15 so that the analog voltages can be converted into digital values by the A/D converter in controller 15.

Drive unit 16 generates a drive signal to open and close first relay SW1 or second relay SW2 based on a control signal from controller 15 and provides the drive signal to first relay SW1 or second relay SW2.

Controller 15 manages electricity storage module 20 based on the total voltage, each voltage, the current, and the temperature of the plurality of cells E1 to Em measured by total voltage measurement unit 11, cell voltage measurement unit 12, temperature measurement unit 13, and current measurement unit 14. For example, if an overvoltage, an undervoltage, an overcurrent, or a temperature abnormality occurs in at least one of the plurality of cells E1 to Em, controller 15 controls drive unit 16 and thus turns off first relay SW1 and/or second relay SW2 to protect the plurality of cells E1 to Em.

Controller 15 includes calculating part 15a and internal impedance table 15b. Controller 15 can be configured with a microcomputer and a non-volatile memory (for example, an EEPROM or a flash memory).

Calculating part 15a estimates a state of charge (SOC) and a state of health (SOH) of each of the plurality of cells E1 to Em. The SOC can be estimated by an open circuit voltage (OCV) method or a current integration method. In the OCV method, the SOC is estimated based on the OCV of each cell E1 to Em measured by cell voltage measurement unit 12 and characteristic data of an SOC-OCV curve held by the non-volatile memory. In the current integration method, the SOC is estimated based on the OCV of each cell E1 to Em measured by cell voltage measurement unit 12 when charging and/or discharging is started and based on an accumulated value of the current measured by current measurement unit 14.

The SOH is defined by a ratio of a current full charge capacity to an initial full charge capacity, and a lower numerical value (closer to 0%) indicates that degradation has further developed. The SOH may be calculated from capacitance measurement by fully charging and/or discharging or may be calculated by adding storage degradation and cycle degradation. The storage degradation can be estimated based on the SOC, the temperature, and a storage degradation speed. The cycle degradation can be estimated based on an SOC range to be used, the temperature, the current rate, and the cycle degradation speed. The storage degradation speed and the cycle degradation speed can be previously derived by an experiment or a simulation. The SOC, the temperature, the SOC range, and the current rate can be obtained by measurement.

Further, the SOH can be estimated based on a correlation between the SOH and an internal resistance of a cell. The internal resistance can be estimated by dividing a voltage drop occurring when a predetermined current flows through a cell for a predetermined time by the predetermined current value. The internal resistance has a relationship that the internal resistance decreases as the temperature rises and has a relationship that the internal resistance increases as the SOH decreases. The degradation of the cell progresses with an increase in the number of charge and discharge cycles. Further, the degradation of the cell depends also on individual differences and usage environments. Therefore, basically, variation in capacities between the plurality of cells E1 to Em increases as the cells are used for a longer period.

Calculating part $15a$ records, in the non-volatile memory, an operation history including the voltage, the current, the temperature, the SOC and the SOH of each cell E1 to Em. In the non-volatile memory, there is stored internal impedance table $15b$. Internal impedance table $15b$ is a table where there is written a characteristic map of the internal impedance of a cell used for electricity storage module 20 for different SOHs, SOCs, and temperatures. The characteristic map of the internal impedance can be derived based on experimental data measured while the conditions of the SOH, SOC, and temperature are being changed, or can be derived based on simulation data calculated while such conditions are being changed.

Although details will be described later, an object of the present exemplary embodiment is to measure a ripple component corresponding to a frequency (100 Hz or 120 Hz in Japan), which is twice a commercial power source frequency (50 Hz or 60 Hz in Japan) superimposed from system 5. The characteristic map of the internal impedance is derived assuming a case where a voltage on which a ripple component at a frequency twice the commercial power source frequency is superimposed is applied to the cell. Note that in a case where a general-purpose system is built, characteristic maps of the internal impedance for different frequency bands may be previously derived and be written in internal impedance table $15b$.

As described above, electricity storage system 1 can be charged from system 5 by being connected to charger 4 installed outside the vehicle with a charging cable. Charger 4 is installed in homes, car dealers, rest areas, commercial facilities, public facilities, and other places. Charger 4 is connected to system 5 and charges electricity storage system 1 in the vehicle through the charging cable.

In the vehicle, second relay SW2 is inserted in connection wires connecting between electricity storage module 20 and charger 4. Note that instead of the relay, another type of switch such as a semiconductor switch may be used. Management device 10 performs control such that second relay SW2 is put in an on-state (closed state) when charging is started and such that second relay SW2 is put in an off-state (open state) when the charging is finished. If management device 10 detects an overvoltage, an undervoltage, an overcurrent, or a temperature abnormality in at least one of the plurality of cells E1 to Em while charging is performed from charger 4, management device 10 turns off second relay SW2 to protect the plurality of cells E1 to Em.

Charger 4 full-wave rectifies the AC power supplied from system 5 and performs smoothing by a filter. Since it is difficult to remove all the periodic components by the filter, the output power of charger 4 is superimposed with a ripple component of a frequency twice the commercial power source frequency.

As described above, along with the prevalence of EV/PHEV, inexpensive and low-spec chargers have been prevailed. A high-spec charger is configured with two converters, where one is a high power factor converter called a power factor correction (PFC) circuit to reduce a harmonic current during charging, and the other is a DC/DC converter that removes a ripple component from the output current, of the PFC circuit, containing a low-frequency ripple and that controls a charging current. Therefore, the ripple of the output current of the charger is small. On the other hand, many low-spec chargers are configured such that the PFC circuit controls the charging current. In that case, the output current of the charger has a large ripple.

Figure 2:
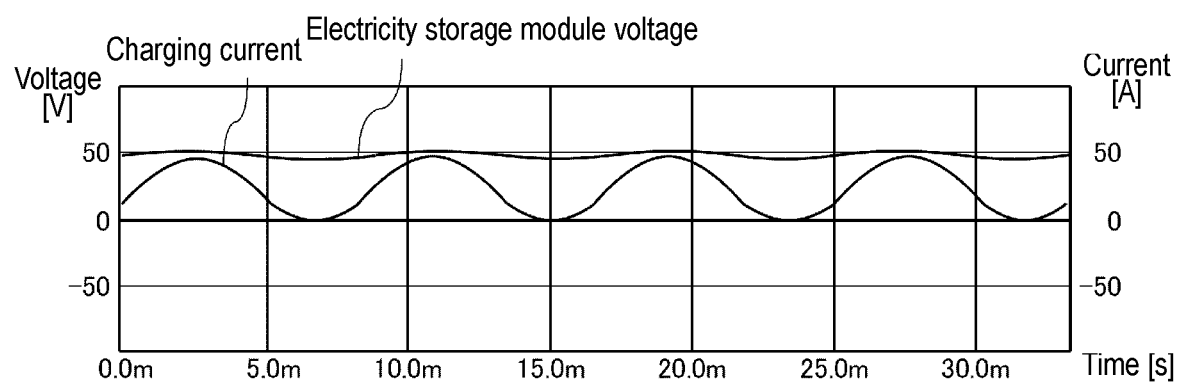
FIG. 2 is a diagram showing an example of output waveforms of a charging current and an electricity storage module voltage when charging is performed with a low-spec charger.

FIG. 2 is a diagram showing an example of output waveforms of a charging current and an electricity storage module voltage when charging is performed with a low-spec charger. The example shown in FIG. 2 shows a state where charging is performed in a state where the voltage of electricity storage module 20 is about 48 V, the charging current is about 23 A, and a charging power is about 1,100 W. As shown in FIG. 2, the charging current pulsates largely. Because it is expected that such chargers will be used more in the future, it will be important that the ripple be addressed on a side of electricity storage system 1.

Figure 3A:
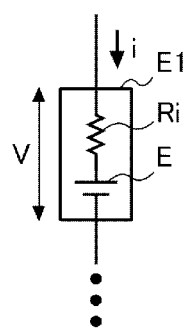
FIGS. 3A to 3C are diagrams each for describing influences of a ripple of a charging current flowing through a cell from a low-spec charger.
Figure 3B:
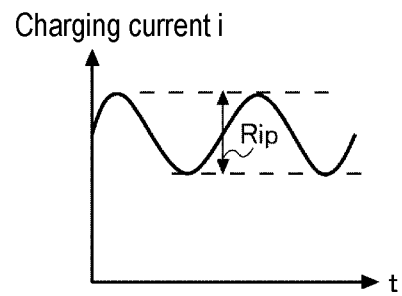
Figure 3C:
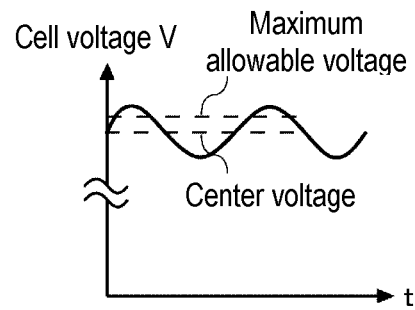

FIGS. 3A to 3C are diagrams each for describing influences of a ripple of a charging current flowing through a cell from a low-spec charger. FIG. 3A is a diagram showing a simple equivalent circuit of cell E1. Cell E1 is configured with a series circuit of electromotive force E and internal resistance Ri. FIG. 3B shows a waveform of charging current i flowing through cell E1 when charging is performed from a low-spec charger. FIG. 3C is a diagram showing a voltage waveform of cell E1 when charging is performed from the low-spec charger. When the pulsation of charging current i is large, the voltage of cell E1 also pulsates being influenced by the pulsation. When the cell voltage pulsates, a probability of the cell voltage surpassing a maximum allowable voltage of cell E1 increases. Therefore, in order to monitor whether an overvoltage is applied to cell E1, it is important to highly accurately measure the ripple of the cell voltage. The ripple of the cell voltage is represented by a peak-to-peak value, which is a difference between a maximum voltage value and a minimum voltage value in a unit cycle. Note that the ripple of the cell voltage can also be represented by a maximum voltage value or a minimum voltage value with respect to a DC component in a unit cycle.

Because the ripple of the cell voltage is a minute voltage fluctuation, a highly accurate voltage measurement circuit is necessary. It is further necessary to sample the cell voltage at a sampling frequency twice or more than a ripple frequency. For that purpose, it can be considered to mount high-spec cell voltage measurement unit 12. However, when high-spec cell voltage measurement unit 12 is mounted, the cost will increase, and the circuit size will also increase. Particularly for in-vehicle use, because the number of series connection of cells is large, the system size and the cost will accordingly largely increase. To address the above issues, in the present exemplary embodiment, a mechanism is introduced in which a ripple of each cell voltage is estimated from a ripple of the total voltage of the plurality of cells E1 to Em.

Figure 4A:
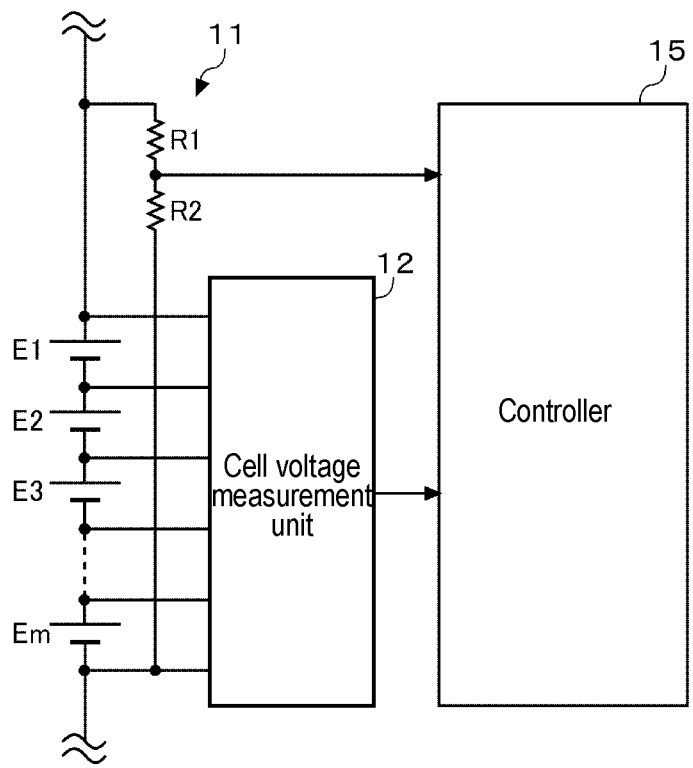
FIGS. 4A and 4B are partial circuit diagrams each showing a configuration example of a total voltage measurement unit.
Figure 4B:
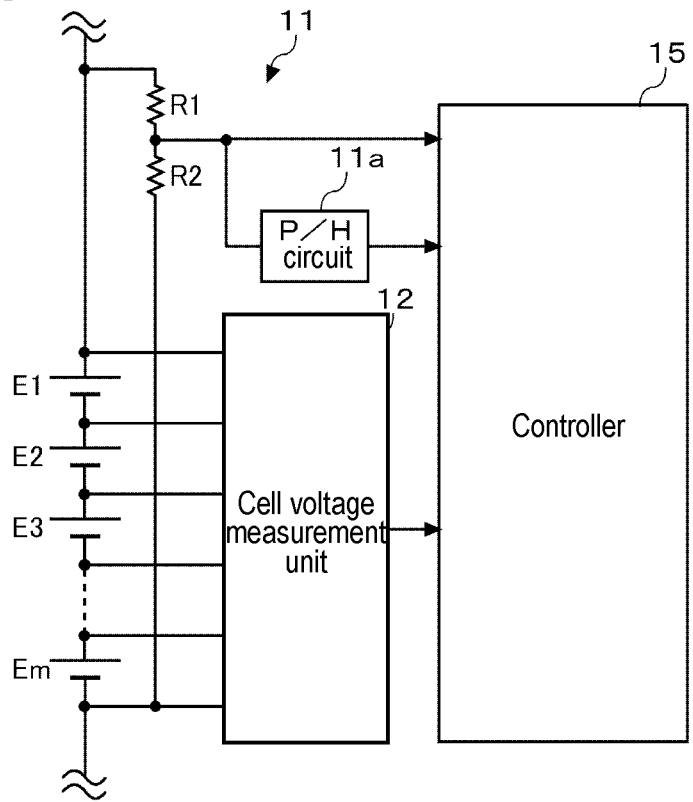

FIGS. 4A and 4B are partial circuit diagrams each showing a configuration example of total voltage measurement unit 11. In the example shown in FIG. 4A, total voltage measurement unit 11 includes series-connected first voltage-dividing resistor R1 and second voltage-dividing resistor R2. A voltage divided by first voltage-dividing resistor R1 and second voltage-dividing resistor R2 is input into an analog input port of controller 15. Note that an operational amplifier may be inserted between the voltage dividing circuit and controller 15. Controller 15 samples the input voltage at a sampling frequency four times or more than the commercial power source frequency. Controller 15 detects the ripple of the total voltage by specifying a maximum voltage value and a minimum voltage value in a predetermined period. The predetermined period is set to a period corresponding to a frequency twice the commercial power source frequency.

In the example shown in FIG. 4B, total voltage measurement unit 11 includes: series-connected first voltage-dividing resistor R1 and second voltage-dividing resistor R2; and peak hold circuit 11a. To an input terminal of peak hold circuit 11a, a voltage divided by first voltage-dividing resistor R1 and second voltage-dividing resistor R2 is applied. As peak hold circuit 11a, a commonly used peak hold circuit can be used in which an operational amplifier, a diode, and a capacitor are used. The capacitor is reset every half a ripple cycle so that peak hold circuit 11a can output a maximum voltage value or a minimum voltage value to controller 15. In this configuration example of controller 15, the sampling frequency can be lower.

Figure 5:
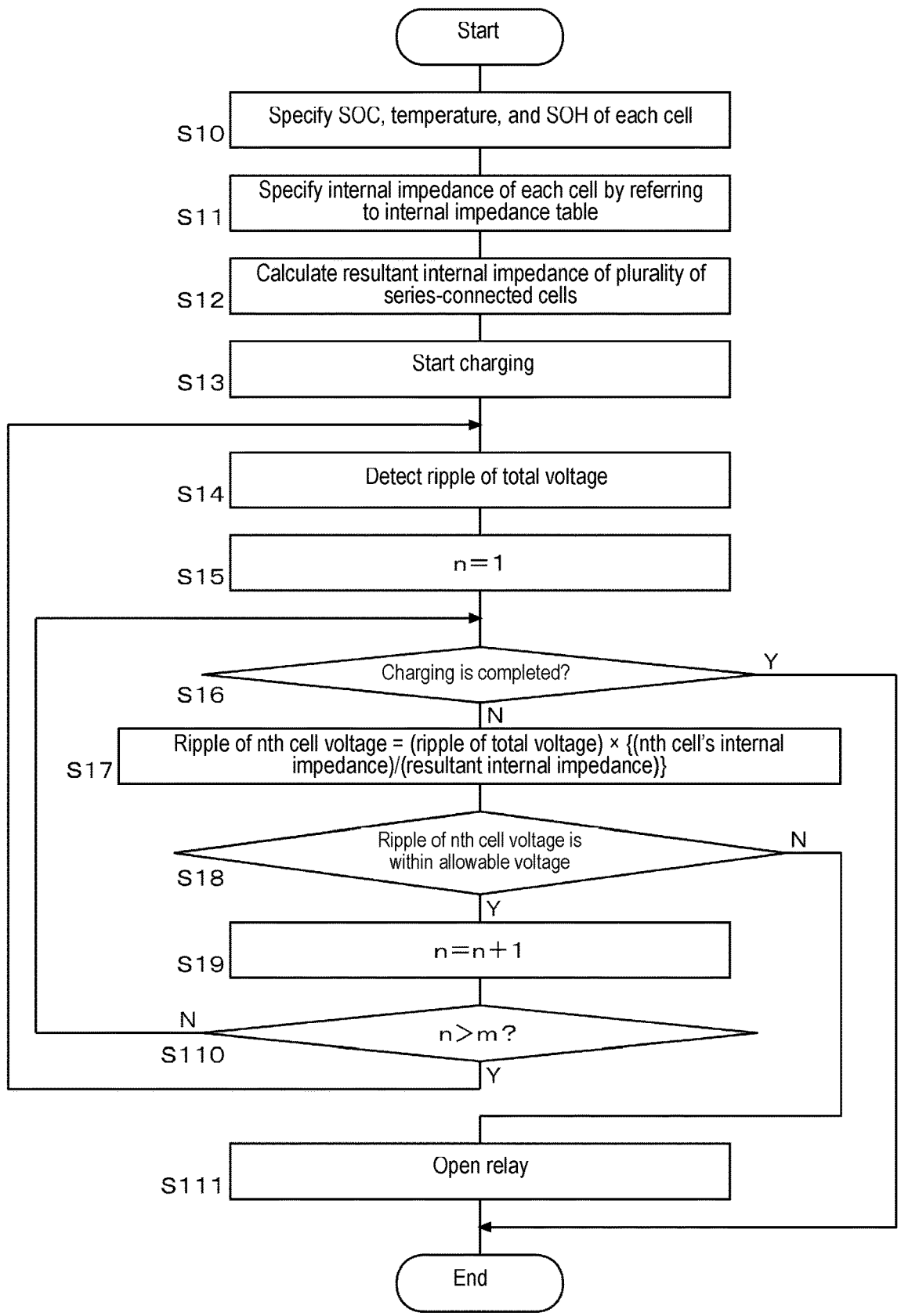
FIG. 5 is a flowchart for describing a ripple measurement method of the electricity storage system according to the first exemplary embodiment of the present invention.

FIG. 5 is a flowchart for describing a ripple measurement method of electricity storage system 1 according to the first exemplary embodiment of the present invention. Controller 15 of management device 10 specifies the SOC, the temperature, and the SOH of each cell E1 to Em (step S10). Based on the specified SOC, temperature, and SOH of each cell E1 to Em, controller 15 specifies the internal impedance of each cell E1 to Em by referring to internal impedance table 15b (step S11). Controller 15 calculates a resultant (=combined) internal impedance of the plurality of series-connected cells E1 to Em by adding up the specified internal impedances of cells E1 to Em (step S12).

When charging of electricity storage module 20 from charger 4 is started (step S13), controller 15 detects the ripple of the total voltage based on the voltage having been input from total voltage measurement unit 11 (step S14). Controller 15 substitutes the value 1 into parameter n as an initial value (step S15).

Controller 15 monitors whether charging is completed (step S16). If the charging is completed (step S16: Y), a ripple measurement process is ended. During charging (step S16: N), controller 15 calculates the ripple of the nth cell voltage by using the following Equation 1 (step S17).

Ripple of nth cell voltage=(ripple of total voltage)×{(nth cell's internal impedance)/(resultant impedance)}  Equation 1

Controller 15 determines whether the ripple of the nth cell voltage is within the allowable voltage range of cell (step S18). If the ripple of the nth cell voltage is over the allowable voltage range of cell (step S18: N), controller 15 opens second relay SW2 (step S111) and ends the ripple measurement process.

If the ripple of the nth cell voltage is within the allowable voltage range of cell (step S18: Y), controller 15 increments parameter n (step S19). Controller 15 compares parameter n with number m of series connection (step S110). If parameter n is less than or equal to number m of series connection (step S110: N), the flow transits to step S16. If parameter n surpasses number m of series connection (step S110: Y), the flow transits to step S14.

As described above, according to the first exemplary embodiment, the ripple of the each cell voltage is estimated by multiplying the ripple of the total voltage by a ratio of the internal impedance of each cell to the resultant internal impedance of the plurality of cells. This arrangement makes it unnecessary for cell voltage measurement unit 12 to measure the ripples of the cell voltages, and it is therefore possible to reduce increase in the system size and the cost along with an improvement of accuracy of cell voltage measurement unit 12. That is, it is possible to use, as is, cell voltage measurement unit 12 that is assumed to be used with a high-spec charger containing almost no ripple component. In addition, it is enough to dispose one total voltage measurement unit 11 regardless of the number of series connection of cells. At this point, in the case where cell voltage measurement unit 12 is used to measure the ripples of cell voltages, the system size and the cost increase as the number of series connections of cells increases. In this way, in a ripple measurement method according to the present exemplary embodiment, the advantage becomes greater as the number of series connections of cells increases.

Note that a high-frequency noise superimposed by a switching power supply of charger 4 can be absorbed by connecting a capacitor to an input stage of electricity storage module 20. In contrast, to absorb a low-frequency noise of 100 Hz or 120 Hz with a capacitor, a capacitor having a large capacitance is necessary, leading to an increase in the system size and the cost. Therefore, the approach in which the low-frequency noise is monitored and the current is shut off as necessary is low in cost than the approach in which the low-frequency noise is removed.

Next, a ripple measurement method of electricity storage system 1 according to a second exemplary embodiment of the present invention will be described. In the second exemplary embodiment, internal impedance table 15b does not have to be stored in the non-volatile memory in controller 15. In the second exemplary embodiment, the internal impedance of each cell E1 to Em is measured before charging.

Figure 6:
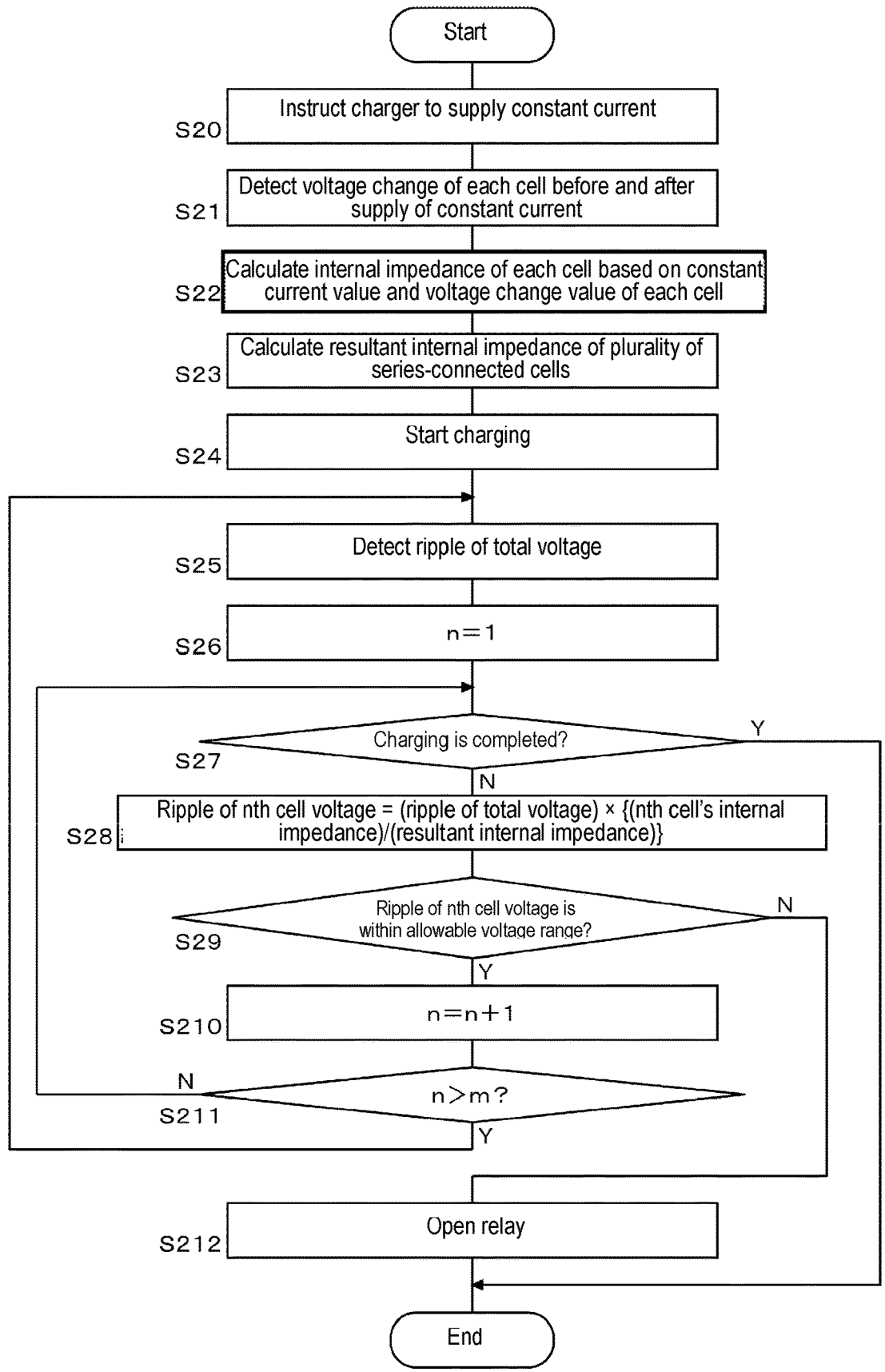
FIG. 6 is a flowchart for describing a ripple measurement method of an electricity storage system according to a second exemplary embodiment of the present invention.

FIG. 6 is a flowchart for describing the ripple measurement method of electricity storage system 1 according to the second exemplary embodiment of the present invention. Before charging from charger 4 is started, controller 15 of management device 10 instructs charger 4 to supply a constant current to electricity storage module 20 for a predetermined period (step S20). Not that if a communication line is included in the charging cable, controller 15 can transmit the above instruction to charger 4 by a communication using the communication line. Alternatively, a power line communication can be used. It is preferable that a value of the constant current be set to a small value.

Controller 15 detects a voltage change of each cell E1 to Em before and after the supply of the constant current from charger 4 (step S21). Controller 15 calculates the internal impedance of each cell E1 to Em based on a value of the constant current supplied from charger 4 and a value of the change in the voltage of each cell E1 to Em (step S22). Controller 15 calculates the resultant internal impedance of the plurality of series-connected cells E1 to Em by adding up the calculated internal impedances of cells E1 to Em (step S23). The process from step S24 to step S212 is the same as the process from step S13 to step S111 of the flowchart in FIG. 5, and is not described below.

As described above, the second exemplary embodiment provides a similar effect to the first exemplary embodiment. In addition, since the second exemplary embodiment does not need internal impedance table 15b, and the development cost can be reduced. Further, since the internal impedance of each cell E1 to Em is measured based on the constant current from charger 4 to be used for charging, the internal impedances can be highly accurately obtained while the ripple component superimposed from charger 4 to be used for charging and environmental conditions are being reflected.

Next, a ripple measurement method of electricity storage system 1 according to a third exemplary embodiment of the present invention will be described. In the third exemplary embodiment, the total voltage of the plurality of cells E1 to Em is not measured to detect the ripple of the total voltage, but the ripple of the cell voltage of one cell E1 is detected. By multiplying the ripple of the cell voltage of one cell E1 by a ratio between the internal impedance of one cell E1 and the internal impedance of each of the other cells E2 to Em, the ripple of the cell voltage of each of the other cells E2 to Em is estimated.

Figure 7A:
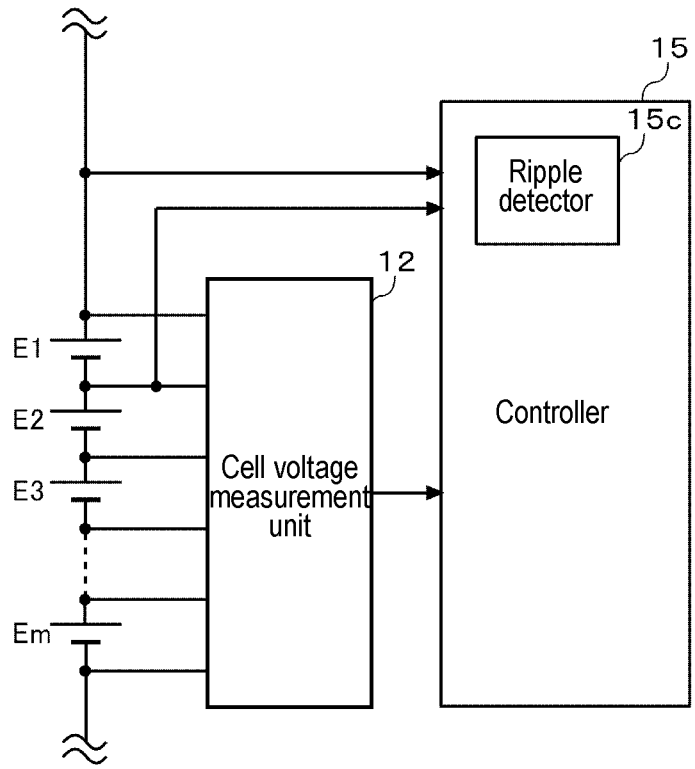
FIGS. 7A and 7B are partial circuit diagrams each showing a configuration example according to a third exemplary embodiment.
Figure 7B:
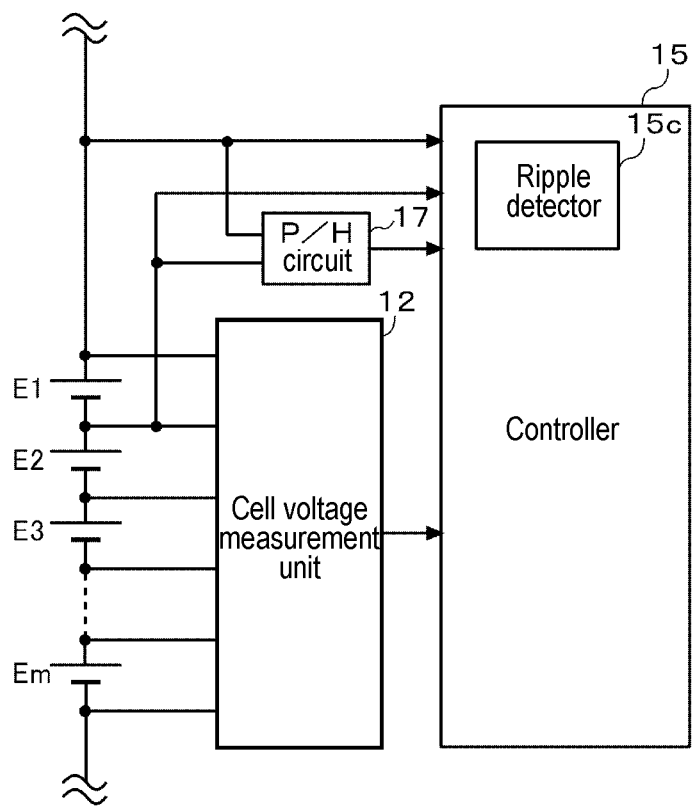

FIGS. 7A and 7B are partial circuit diagrams each showing a configuration example according to a third exemplary embodiment. In the third exemplary embodiment, total voltage measurement unit 11 is omitted. Ripple detector 15c in controller 15 detects the ripple of the cell voltage of one cell E1. However, in the first exemplary embodiment shown in FIGS. 4A to 4B, ripple detector 15c in controller 15 detects the ripple of the total voltage of the plurality of cells E1 to Em. Note that ripple detector 15c can be independently provided outside controller 15.

As described above, according to the third exemplary embodiment, the ripple of the cell voltage of each of the cells other than the one cell is estimated by multiplying the ripple of the cell voltage of the one cell by a ratio between the internal impedance of such one cell and the internal impedance of each of the other cells. With this arrangement, it is enough to measure the ripple of the cell voltage of only one cell, and it is possible to reduce increase in the system size and the cost of cell voltage measurement unit 12.

The present invention has been described based on the exemplary embodiments. The exemplary embodiments are merely examples, and those skilled in the art will understand that various modifications can be made in the combination of configuration elements and the processes in the exemplary embodiments and that such modifications are also within the scope of the present invention.

In the above exemplary embodiments described, the description has been given on the examples in which the above ripple measurement method is used in electricity storage system 1 for in-vehicle use. However, the above ripple measurement method can be used also in electricity storage system 1 for stationary electricity storage use. In addition, the above ripple measurement method can be used also in electricity storage system 1 for electronic equipment use such as laptop PCs and smartphones.

Note that exemplary embodiments may be specified by the following items.

[Item 1]

Management device (10) including:

cell voltage measurement unit (12) that measures a voltage of each cell of a plurality of cells (E1 to Em) that are series-connected;

total voltage measurement unit (11) that measures a total voltage of the plurality of cells (E1 to Em); and controller (15) that manages an internal impedance of each cell of the plurality of cells (E1 to Em), in which controller (15) detects a ripple of the total voltage measured by total voltage measurement unit (11), estimates a ripple of each cell voltage by multiplying the ripple, which is detected, of the total voltage by a ratio of the internal impedance of each cell (En) to a resultant internal impedance of the plurality of cells (E1 to Em), and determines whether the ripple of each cell voltage is within an allowable voltage range.

This configuration enables to measure the ripple of the voltage of each of the plurality of cells (E1 to Em), with an inexpensive and small-scale circuit.

[Item 2]

Management device (10) including:

cell voltage measurement unit (12) that measures a voltage of each cell of a plurality of cells (E1 to Em) that are series-connected;

ripple detector (15a) that detects a ripple of a cell voltage of part (E1) of the plurality of cells (E1 to Em);

controller (15) that manages an internal impedance of each cell of the plurality of cells (E1 to Em), in which controller (15) estimates a ripple of each cell voltage, based on the ripple of the voltage detected by ripple detector (15a) and on the internal impedance of each of the plurality of cells (E1 to Em), and determines whether the ripple of each cell voltage is within an allowable voltage range.

This configuration enables to measure the ripple of the voltage of each of the plurality of cells (E1 to Em), with an inexpensive and small-scale circuit.

[Item 3]

Management device (10) according to item 2, in which ripple detector (15a) is disposed on controller (15).

This configuration can minimize the system size.

[Item 4]

Management device (10) according to any one of items 1 to 3, in which controller (15) manages the internal impedance of each cell in a frequency band corresponding to a frequency twice a commercial power source frequency.

This configuration enables to highly accurately measure a ripple component superimposed from system (5).

[Item 5]

Management device (10) according to any one of items 1 to 4, further including:

current measurement unit (14) that measures a current flowing through the plurality of cells (E1 to Em); and temperature measurement unit (13) that measures a temperature of the plurality of cells (E1 to Em), in which controller (15) includes table (15b) where characteristic data of a state of health (SOH), a state of charge (SOC), and an internal impedance of each of cells (E1 to Em) at different temperatures is described, and controller (15) specifies the internal impedance of each cell (En) by referring to table (15b) based on the SOH, the SOC, and the temperature of each cell (En).

This configuration enables to highly accurately estimate the internal impedance of each cell (En).

[Item 6]

Management device (10) according to any one of items 1 to 4, further including current measurement unit (14) that measures a current flowing through the plurality of cells (E1 to Em), in which controller (15) estimates the internal impedance of each cell (En) based on a voltage change of each cell (En) before and after supplying a predetermined current to the plurality of cells (E1 to Em).

This configuration enables to highly accurately estimate the internal impedance of each cell (En).

[Item 7]

Electricity storage system (1) including:

a plurality of cells (E1 to Em) that are series-connected; and management device (10) according to any one of items 1 to 6 that manages the plurality of cells (E1 to Em).

This configuration can constitute electricity storage system (1) that can measure the ripple of the voltage of each of the plurality of cells (E1 to Em), with an inexpensive and small-scale circuit.

REFERENCE MARKS IN THE DRAWINGS

1: electricity storage system
2: inverter
3: motor
4: charger
5: system
SW1: first relay
SW2: second relay
10: management device
11: total voltage measurement unit
12: cell voltage measurement unit
13: temperature measurement unit
14: current measurement unit
15: controller
15a: calculating part
15b: internal impedance table
16: drive unit
20: electricity storage module
E1 to Em: cell
Rs: shunt resistor
T1: temperature sensor
R1: first voltage-dividing resistor
R2: second voltage-dividing resistor
11a: peak hold circuit

The invention claimed is:

1. A management device comprising:
a cell voltage measurement unit that measures a voltage of each cell of a plurality of cells that are series-connected;
a total voltage measurement unit that measures a total voltage of the plurality of cells; and
a controller that manages an internal impedance of each cell of the plurality of cells,
wherein the controller detects a ripple of the total voltage measured by the total voltage measurement unit, estimates a ripple of each cell voltage by multiplying the ripple, which is detected, of the total voltage by a ratio of the internal impedance of each cell to a resultant internal impedance of the plurality of cells, and determines whether the ripple of each cell voltage is within an allowable voltage range.

2. A management device comprising:
a cell voltage measurement unit that measures a voltage of each cell of a plurality of cells that are series-connected;
a ripple detector that detects a ripple of a cell voltage of a part of the plurality of cells;
a controller that manages an internal impedance of each cell of the plurality of cells,
wherein the controller estimates a ripple of each cell voltage, based on the ripple of the voltage detected by the ripple detector and on the internal impedance of each of the plurality of cells, and determines whether the ripple of each cell voltage is within an allowable voltage range.

3. The management device according to claim 2, wherein the ripple detector is disposed on the controller.

4. The management device according to claim 1, wherein the controller manages the internal impedance of each cell in a frequency band corresponding to a frequency twice a commercial power source frequency.

5. The management device according to claim 1, further comprising:
a current measurement unit that measures a current flowing through the plurality of cells; and
a temperature measurement unit that measures a temperature of the plurality of cells,
wherein the controller includes a table where characteristic data of a state of health (SOH), a state of charge (SOC), and an internal impedance of each of the cells at different temperatures is described, and
the controller specifies the internal impedance of each cell by referring to the table based on the SOH, the SOC, and the temperature of each cell.

6. The management device according to claim 1, further comprising a current measurement unit that measures a current flowing through the plurality of cells,
wherein the controller estimates the internal impedance of each cell based on a voltage change of each cell before and after supplying a predetermined current to the plurality of cells.

7. An electricity storage system comprising:
a plurality of cells that are series-connected; and
the management device according to claim 1 that manages the plurality of cells.

8. The management device according to claim 2, wherein the controller manages the internal impedance of each cell in a frequency band corresponding to a frequency twice a commercial power source frequency.

9. The management device according to claim 2, further comprising:
a current measurement unit that measures a current flowing through the plurality of cells; and
a temperature measurement unit that measures a temperature of the plurality of cells,
wherein the controller includes a table where characteristic data of a state of health (SOH), a state of charge (SOC), and an internal impedance of each of the cells at different temperatures is described, and
the controller specifies the internal impedance of each cell by referring to the table based on the SOH, the SOC, and the temperature of each cell.

10. The management device according to claim 2, further comprising a current measurement unit that measures a current flowing through the plurality of cells,
wherein the controller estimates the internal impedance of each cell based on a voltage change of each cell before and after supplying a predetermined current to the plurality of cells.

11. An electricity storage system comprising:
a plurality of cells that are series-connected; and
the management device according to claim 2 that manages the plurality of cells.

* * * * *